(12) United States Patent
Kwon et al.

(10) Patent No.: US 9,418,966 B1
(45) Date of Patent: Aug. 16, 2016

(54) SEMICONDUCTOR ASSEMBLY HAVING BRIDGE MODULE FOR DIE-TO-DIE INTERCONNECTION

(71) Applicant: Xilinx, Inc., San Jose, CA (US)

(72) Inventors: Woon-Seong Kwon, Cupertino, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/665,908

(22) Filed: Mar. 23, 2015

(51) Int. Cl.
| | |
|---|---|
| *H01L 23/00* | (2006.01) |
| *H01L 25/065* | (2006.01) |
| *H01L 25/00* | (2006.01) |
| *H01L 21/56* | (2006.01) |
| *H01L 23/31* | (2006.01) |
| *H01L 23/535* | (2006.01) |
| *H01L 23/528* | (2006.01) |
| *H01L 23/498* | (2006.01) |

(52) U.S. Cl.
CPC ............ *H01L 25/0655* (2013.01); *H01L 21/56* (2013.01); *H01L 23/3107* (2013.01); *H01L 23/49838* (2013.01); *H01L 23/528* (2013.01); *H01L 23/535* (2013.01); *H01L 24/81* (2013.01); *H01L 25/50* (2013.01); *H01L 2224/81203* (2013.01); *H01L 2224/81801* (2013.01); *H01L 2924/14* (2013.01)

(58) Field of Classification Search
None
See application file for complete search history.

(56) References Cited

U.S. PATENT DOCUMENTS

| | | | |
|---|---|---|---|
| 9,190,297 B2 * | 11/2015 | Choi | ............ H01L 21/561 |
| 2006/0226527 A1 | 10/2006 | Hatano et al. | |
| 2011/0285006 A1 | 11/2011 | Weng et al. | |
| 2013/0168854 A1 | 7/2013 | Karikalan et al. | |
| 2014/0070380 A1 | 3/2014 | Chiu et al. | |
| 2014/0353827 A1 * | 12/2014 | Liu | .............. H01L 24/33 |
| | | | 257/751 |

* cited by examiner

*Primary Examiner* — Alexander Ghyka
(74) *Attorney, Agent, or Firm* — Robert M. Brush (57) ABSTRACT

In one example, a semiconductor assembly comprises a first IC die, a second IC die, and a bridge module. The first IC die includes, on a top side thereof, first interconnects of a plurality of interconnects and first inter-die contacts of a plurality of inter-die contacts. The second IC die includes, on a top side thereof, second interconnects of the plurality of interconnects and second inter-die contacts of the plurality of inter-die contracts. The bridge module is disposed between the first interconnects and the second interconnects and includes bridge interconnects on a top side thereof, the bridge interconnects mechanically and electrically coupled to the plurality of inter-die contacts, and layer(s) of conductive interconnect disposed on the top side thereof to route signals between the first IC and the second IC. A back side of the bridge module does not extend beyond a height of the plurality of interconnects.

12 Claims, 7 Drawing Sheets

SEMICONDUCTOR ASSEMBLY HAVING BRIDGE MODULE FOR DIE-TO-DIE INTERCONNECTION

TECHNICAL FIELD

Examples of the present disclosure generally relate to semiconductor devices and, in particular, to a semiconductor assembly having a bridge module for die-to-die interconnection.

BACKGROUND

Integrated circuits (IC) architectures have evolved to incorporate a number of heterogeneous functions in a single package, where each function is performed by a separate IC the or chip-scale package (CSP). Such an architecture is sometimes referred to as a system-in-package (SiP). One type of SiP architecture involves mounting multiple IC die to an interposer, which is in turn mounted to a package substrate. The interposer includes through-die vias (TDVs), also referred to as through-silicon vias (TSVs), which connect metallization layers on both its upper and lower surfaces. The metallization layers are used to convey electrical signals among the multiple IC die, and between each of multiple IC the to the package substrate. This type of SiP architecture is sometimes referred to as a 2.5 dimensional (2.5D) package. However, use of a 2.5D architecture for a SiP package significantly increases costs, as a separate interposer must be designed, manufactured, and tested.

SUMMARY

Techniques for providing a semiconductor assembly having a bridge module for die-to-die interconnection are described. In an example, a semiconductor assembly comprises a first IC die, a second IC die, and a bridge module. The first IC die includes, on a top side thereof, first interconnects of a plurality of interconnects and first inter-die contacts of a plurality of inter-die contacts. The second IC die includes, on a top side thereof, second interconnects of the plurality of interconnects and second inter-die contacts of the plurality of inter-die contacts. The bridge module is disposed between the first interconnects and the second interconnects. The bridge module includes bridge interconnects on a top side thereof, the bridge interconnects mechanically and electrically coupled to the plurality of inter-die contacts, and one or more layers of conductive interconnect disposed on the top side thereof to route signals between the first IC and the second IC. A back side of the bridge module does not extend beyond a height of the plurality of interconnects.

In another example, an IC package includes a package substrate, a first IC die, a second IC die, and a bridge module. The first IC die includes, on a top side thereof, first interconnects of a plurality of interconnects and first inter-die contacts of a plurality of inter-die contacts, the first interconnects electrically and mechanically coupled to a top side of the package substrate. The second IC die includes, on a top side thereof, second interconnects of the plurality of interconnects and second inter-die contacts of the plurality of inter-die contracts, the second interconnects electrically and mechanically coupled to the top side of the package substrate. The bridge module is disposed between the first interconnects and the second interconnects, a backside of the bridge module being spaced apart from the package substrate. The bridge module includes bridge interconnects on a top side thereof, the bridge interconnects mechanically and electrically coupled to the plurality of inter-die contacts, and one or more layers of conductive interconnect disposed on the top side thereof to route signals between the first IC and the second IC.

In another example, a method of manufacturing a semiconductor assembly comprises: forming a carrier substrate having cavities and a release layer disposed thereon; placing a bridge module in one of the cavities, the bridge module including bridge interconnects on a top side thereof and one or more layers of conductive interconnect disposed on the top side thereof; placing a first integrated circuit (IC) die on the carrier substrate such that first interconnects thereof are disposed in a plurality of the cavities; placing a second IC die on the carrier substrate such that second interconnects thereof are disposed in a plurality of the cavities; coupling the bridge interconnects to inter-die contacts of the first IC die and the second IC die; and separating a semiconductor assembly comprising the first IC die, the second IC die, and the bridge module from the carrier substrate by releasing the release layer.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

Techniques for providing a semiconductor assembly having a bridge module for die-to-die interconnection are described. In an example, a semiconductor assembly includes a bridge module configured to electrically connect a pair of integrated circuit (IC) die. The bridge module includes bridge interconnects configured for mechanical and electrical coupling to inter-die contacts on the IC die. The IC die and the bridge module are mechanically secured using an epoxy or molding compound. The semiconductor assembly can be formed using a carrier substrate and then separated from the carrier substrate and mounted to a package substrate of a SiP package, to a printed circuit board (PCB), or the like. The bridge module supports electrical connections between the IC die and thus eliminates the need for an interposer between the IC die and the package substrate/PCB. The bridge module is separate from the package substrate/PCB. As such, bridge module can be constructed without the concern of mismatch between the coefficient of thermal expansion (CTE) of the package substrate/PCB and the CTE of the bridge module. The semiconductor assembly is pre-fabricated and does not rely on sequential build-up of the bridge module, package substrate/PCB, and IC die. Further, the pre-fabricated semiconductor assembly avoids complex die embedding steps involved when embedding a bridge die in an organic substrate, such as a package substrate or PCB. Accordingly, the pre-fabricated semiconductor assembly is not dependent on any particular package substrate or PCB.

Figure 1A:
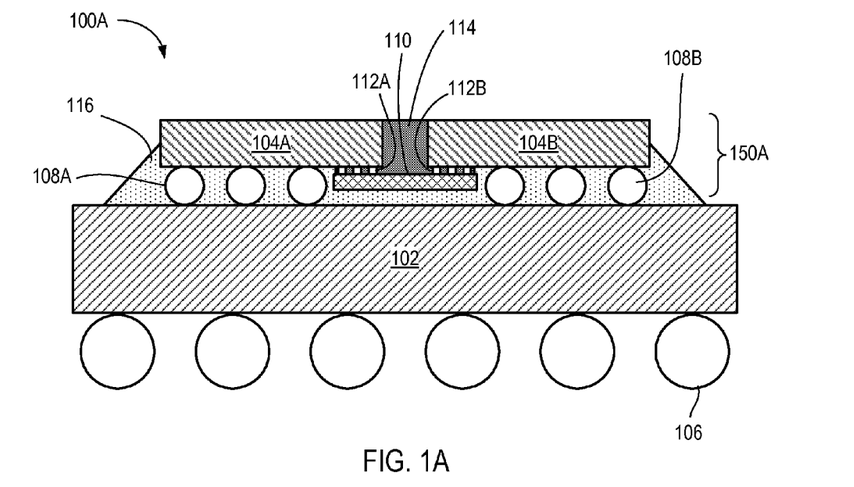
FIG. 1A is a schematic cross-sectional diagram showing an example of an integrated circuit (IC) package.

FIG. 1A is a schematic cross-sectional diagram showing an example of an integrated circuit (IC) package 100A. The IC package 100A includes a package substrate 102 supporting a plurality of IC die (e.g., a first IC die 104A and a second IC die 104B are shown). While only two IC die are shown for purposes of clarity by example, it will be apparent to one skilled in the art that the techniques described herein can be employed with a semiconductor assembly having more than two IC die. The IC die mounted to the package substrate 102 are collectively referred to as "IC die 104". The package substrate 102 is coupled to a plurality of interconnects 106 on one side, and supports the first IC die 104A and the second IC die 104B on an opposite side. The plurality of interconnects 106 can comprise, for example, a plurality of solder balls configured for mounting the IC package 100A to a printed circuit board (PCB) or the like.

Each of the IC die 104 includes a "top side" and a "back side". Each of the IC die 104 is configured for "flip-chip" mounting to the package substrate 102 such its top side faces the package substrate 102. The back side of each of the IC die 104 is the side opposite the top side. The IC die 104A includes a top side coupled to a plurality of interconnects ("interconnects 108A"). The interconnects 108A can include solder bumps (e.g., controlled collapse chip connection (C4) bumps) or the like. The interconnects 108A mechanically and electrically couple the IC die 104A to the package substrate 102. Similar to the IC die 104A, the IC die 104B includes a top side coupled to a plurality of interconnects ("interconnects 108B"). The interconnects 108B can include solder bumps (e.g., C4 bumps) or the like. The interconnects 108B mechanically and electrically couple the IC die 104B to the package substrate 102. The interconnects 108A and the interconnects 108B collectively comprise a plurality of interconnects ("interconnects 108").

The IC package 100A further includes a bridge module 110 configured to electrically couple the IC die 104A and the IC die 104B. For example, the bridge module 110 can support the transfer of electrical signals between the IC die 104A and the IC die 104B. The bridge module 110 is disposed between the interconnects 108A and the interconnects 108B. The bridge module 110 includes a top side coupled to a plurality of bridge interconnects ("bridge interconnects 112"). The "top side" of the bridge module 110 is the side that faces the top sides of the IC die 104. A "back side" of the bridge module 110 is the side opposite its top side.

In an example, the backside of the bridge module 110 does not extend beyond a height of the interconnects 108 of the IC die 104. That is, the bridge module 110 is spaced apart from the package substrate 102. In another example, the backside of the bridge module 110 can physically contact the package substrate 102, but the backside of the bridge module 110 is not electrically connected to the package substrate 102. The bridge module 110 can include metallization layers formed on a substrate, such as a ceramic substrate, an organic substrate, or a semiconductor substrate. In an example, the bridge module 110 comprises a semiconductor substrate having solid state circuitry formed thereon.

The bridge interconnects 112 include a first set of bridge interconnects ("bridge interconnects 112A") electrically and mechanically coupled to inter-die contacts (shown in FIG. 6A) of the IC die 104A, and a second set of bridge interconnects ("bridge interconnects 112B") electrically and mechanically coupled to inter-die contacts (shown in FIG. 6B) of the IC die 104B. In an example, the bridge interconnects 112 comprise solder bumps (e.g., C4 bumps) that are soldered to respective inter-die contacts of the IC die 104A and the IC die 104B. In another example, the bridge interconnects 112 comprise metal contacts that are bonded to respective inter-die contacts of the IC die 104A and the IC die 104B (e.g., diffusion bonding, pressure joining, thermocompression welding, each of which is generally referred to as "thermocompression bonding" herein). In such an example, the bridge interconnects 112 can comprise aluminum, copper, gold, or the like.

The IC die 104A, the IC die 104B, and the bridge module 110 form a semiconductor assembly 150A. In the example shown, the semiconductor assembly 150A includes an epoxy or like-type bonding compound for mechanical support. For example, an epoxy 114 is disposed between the IC die 104A and the IC die 104B to bond the IC die 104A to the IC die 104B. The epoxy 114 is also disposed between the bridge module 110 and each of the IC die 104A and the IC die 104B to bond the bridge module 110 to each of the IC die 104A and the IC die 104B. The IC package 100A includes underfill 116 disposed between the semiconductor assembly 150A and the package substrate 102. Various underfill materials that can be used as underfill 116 are well-known in the art.

Figure 1B:
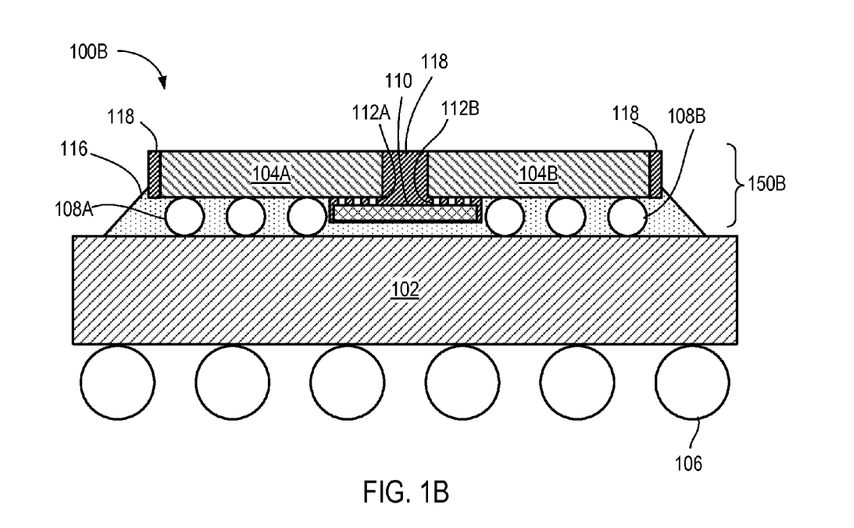
FIG. 1B is a schematic cross-sectional diagram showing another example of an IC package.

FIG. 1B is a schematic cross-sectional diagram showing another example of an IC package 100B. Elements in FIG. 1B that are the same or similar to those in FIG. 1A are designated with identical reference numerals and described in detail above. In the present example, a semiconductor assembly 150B comprises the IC die 104A, the IC die 104B, and the bridge module 110. Although only two IC die are shown by example, other examples of the semiconductor assembly 150B can include more than two IC die. The semiconductor assembly 150B differs from the semiconductor assembly 150A in that a molding compound 118 is used to support the assembly, rather than the epoxy 114. The molding compound 118 can encapsulate the IC die 104A, the IC die 104B, and the bridge module 110. The molding compound 118 can comprise any type of material suitable for such purpose known in the art, such as an epoxy molding compound.

Figure 2A:
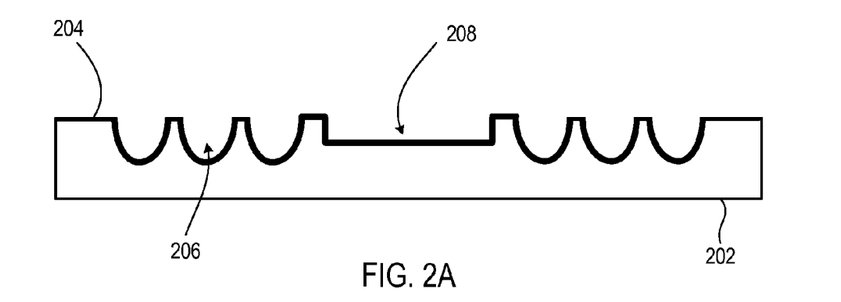
FIGS. 2A-2C are schematic cross-sectional diagrams showing an example of a process of manufacturing a semiconductor assembly.
Figure 2B:
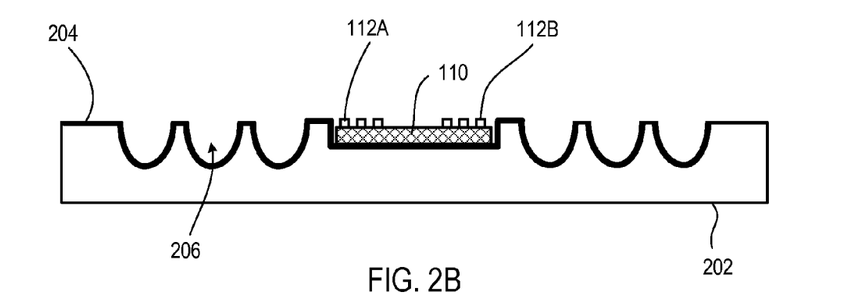
Figure 2C:
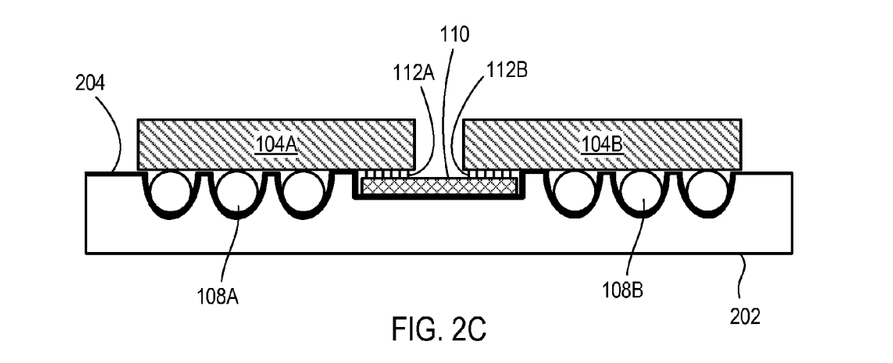

FIGS. 2A-2C are schematic cross-sectional diagrams showing an example of a process of manufacturing a semiconductor assembly, such as the semiconductor assembly 150A or the semiconductor assembly 150B. Elements in FIGS. 2A-2C that are the same or similar to those in FIGS. 1A-1B are designated with identical reference numerals. As shown in FIG. 2A, a carrier substrate 202 is processed to form a bridge module cavity 208 and interconnect cavities 206 therein. The carrier substrate 202 can comprise, for example, a silicon substrate. The cavities 206 and 208 can be formed using well-known semiconductor processing techniques. A release layer 204 is deposited over the carrier substrate 202, including within the cavities 206 and 208. The release layer 204 can include any type of material suitable for temporarily attaching to the carrier substrate 202 and capable of being released from the carrier substrate 202.

As shown in FIG. 2B, a bridge module 110 is placed in the bridge module cavity 208. As shown in FIG. 2C, the IC die 104A is placed on the carrier substrate 202 such that the interconnects 108A are aligned with and disposed in respective cavities 206 of the carrier substrate 202. The IC die 104B is placed on the carrier substrate 202 such that the interconnects 108B are aligned with and disposed in respective cavities 206 of the carrier substrate 202. Accordingly, the cavities 206 are formed in the carrier substrate 202 in a pattern that accommodates a layout of the interconnects 108A of the IC die 104A and the interconnects 108B of the IC die 104B. The cavities 206 are formed having a depth that accommodates a height of the interconnects 108.

The cavities 206 are further configured such that inter-die contacts of the IC die 104B (shown in FIG. 6A) are aligned with the bridge interconnects 112A, and inter-die contacts of the second IC die 104B (shown in FIG. 6B) are aligned with the bridge interconnects 112B. The width of the bridge cavity 208 is configured to accommodate the width of the bridge module 110. Thus, the width of the bridge cavity 208 is at least equal to the width of the bridge module 110. The depth of the bridge cavity 208 is such that the bridge interconnects 112 are in contact the inter-die contacts of the IC die 104A and the IC die 104B.

Figure 3A:
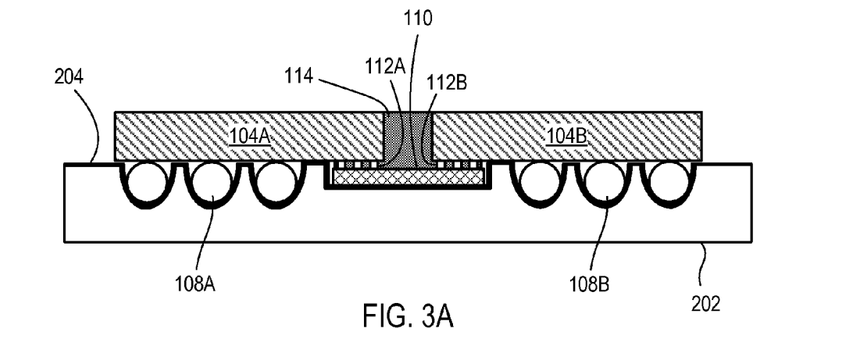
FIGS. 3A-3B are schematic cross-sectional diagrams showing an example of a process of manufacturing the semiconductor assembly of FIG. 1A.
Figure 3B:
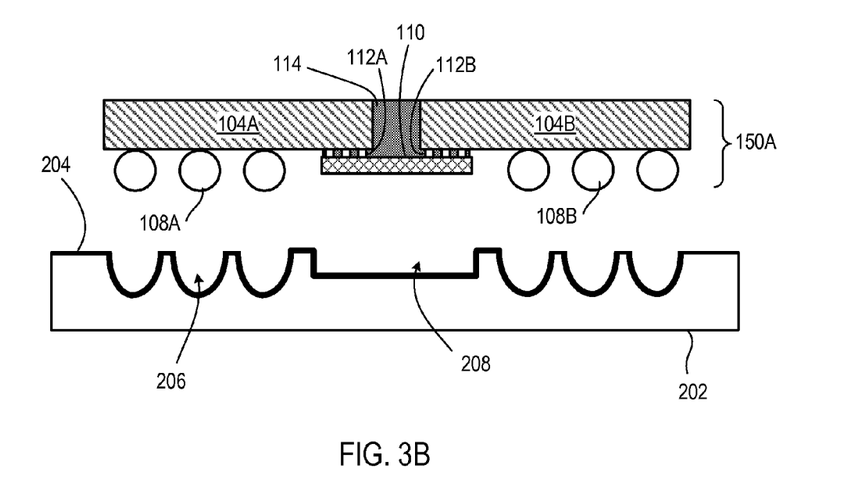

FIGS. 3A-3B are schematic cross-sectional diagrams showing an example of a process of manufacturing the semiconductor assembly 150A. The process steps shown in FIGS. 3A-3B are performed subsequent to the process steps shown in FIGS. 2A-2C. Elements in FIGS. 3A-3B that are the same or similar to those in FIGS. 1A and 2A-2C and are designated with identical reference numerals. As shown in FIG. 3A, an epoxy 114 or other type of bonding compound is deposited between the IC die 104A and the IC die 104B. The epoxy 114 spreads among the bridge interconnects 112 of the bridge module 110 and between the bridge module 110 and each of the IC die 104A and the IC die 104B. The epoxy 114 fills the space between the IC die 104A and the IC die 104B. The epoxy 114 can fill the entire space between the IC die 104A and the IC die 104B, or less than the entire space (e.g., the height of the epoxy 114 can be less than height of the IC die 104A, 104B). The epoxy 114 can also spread between the bridge module 110 and the carrier substrate 202. The epoxy 114 cures to provide support for the semiconductor assembly 150A.

Figure 5A:
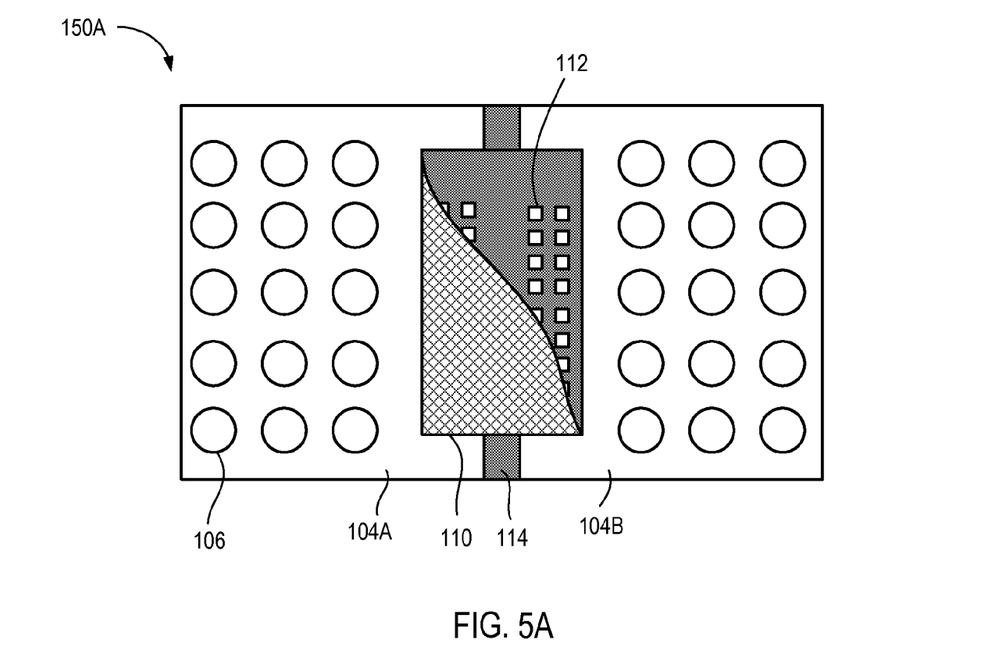
FIGS. 5A-5B are top-views of semiconductor assemblies after separation from a carrier substrate.

As shown in FIG. 3B, the semiconductor assembly 150A is separated from the carrier substrate 202 by releasing the release layer 204. The semiconductor assembly 150A can be separated after the epoxy 114 has cured. The separated semiconductor assembly 150A can then be mounted to a package substrate, PCB, or the like. FIG. 5A is a top-view of the semiconductor assembly 150A after separation from the carrier substrate 202. A portion of the bridge module 110 is cut-away to show the bridge interconnects 112. As shown, the epoxy 114 is disposed between IC die 104A and IC die 104B, and disposed around the bridge interconnects 112 of the bridge module 110 and between the bridge module 110 and each of the IC die 104A and 104B.

Figure 4A:
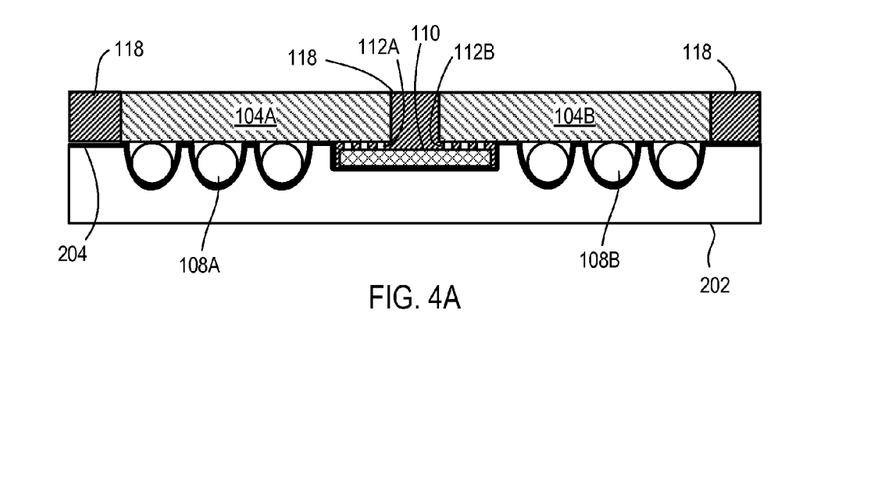
FIGS. 4A-4B are schematic cross-sectional diagrams showing an example of a process of manufacturing the semiconductor assembly of FIG. 1B.
Figure 4B:
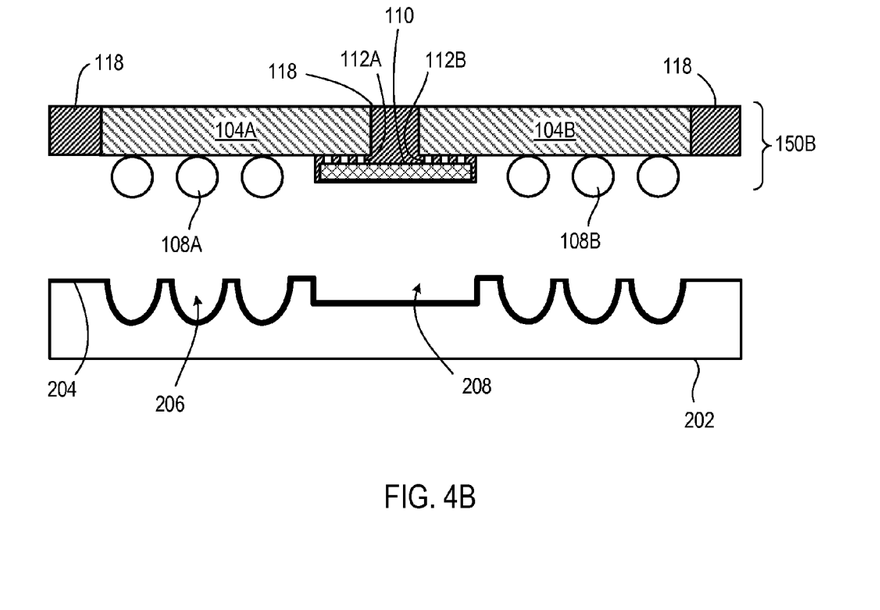

FIGS. 4A-4B are schematic cross-sectional diagrams showing an example of a process of manufacturing the semiconductor assembly 150B. The process steps shown in FIGS. 4A-4B are performed subsequent to the process steps shown in FIGS. 2A-2C. Elements in FIGS. 4A-4B that are the same or similar to those in FIGS. 1B and 2A-2C and are designated with identical reference numerals. As shown in FIG. 4A, a molding compound 118 is deposited on the carrier substrate 202 to encapsulate the IC die 104A, the IC die 104B, and the bridge module 110. The molding compound 118 surrounds outer edges of the IC die 104A and 104B and is disposed between the IC die 104A and the IC die 104B. The molding compound 118 also spreads among the bridge interconnects 112 and between the bridge module 110 and each of the IC die 104A and 104B. The molding compound 118 can also spread between the bridge module 110 and the carrier substrate 202. The molding compound cures to provide support for the semiconductor assembly 150B.

Figure 5B:
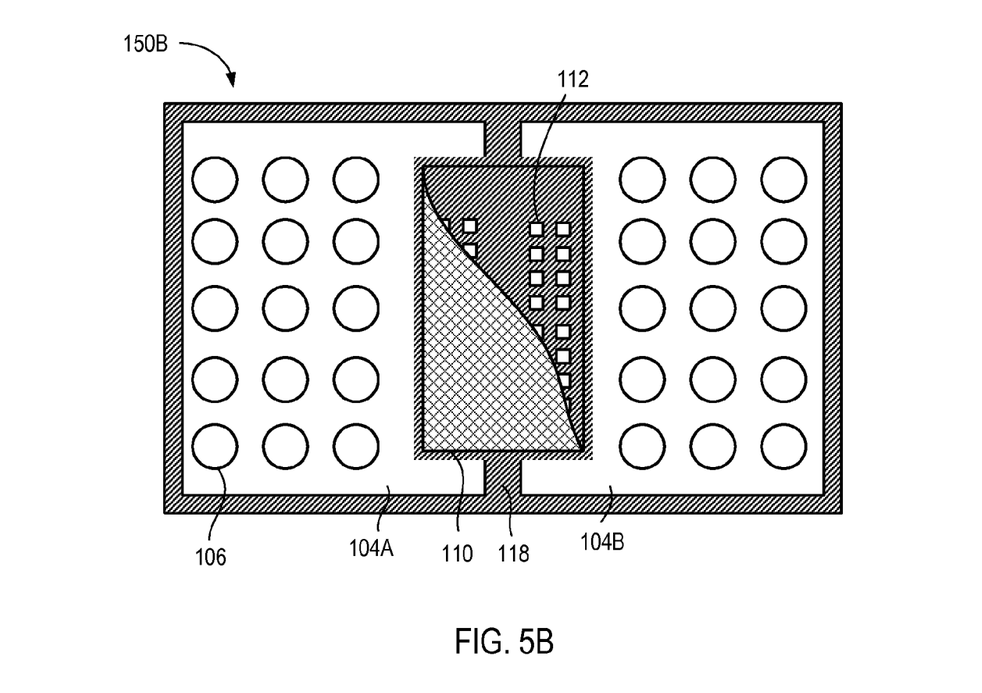

As shown in FIG. 4B, the semiconductor assembly 150B is separated from the carrier substrate 202 by releasing the release layer 204. The semiconductor assembly 150B can be separated after the molding compound 118 has cured. The separated semiconductor assembly 150B can then be mounted to a package substrate, PCB, or the like. FIG. 5B is a top-view of the semiconductor assembly 150B after separation from the carrier substrate 202. A portion of the bridge module 110 is cut-away to show the bridge interconnects 112. As shown, the molding compound 118 surrounds the IC die 104A and 104B and is disposed between IC die 104A and IC die 104B. The molding compound 118 is also disposed around the bridge interconnects 112 of the bridge module 110 and between the bridge module 110 and each of the IC die 104A and 104B.

Figure 6A:
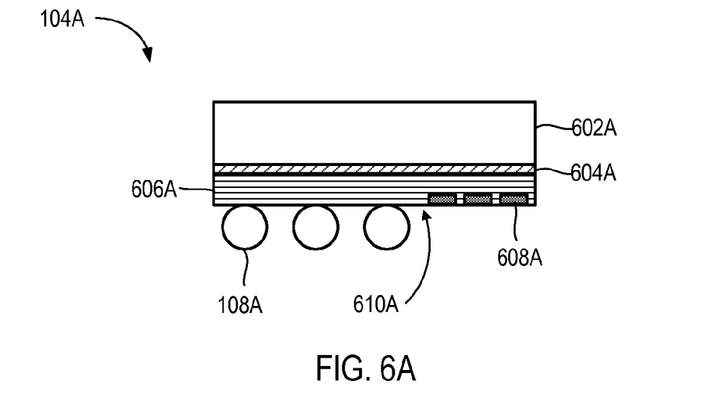
FIGS. 6A-6B are schematic cross-sectional diagrams showing examples of IC die.

FIG. 6A is a schematic cross-sectional diagram showing an example of the IC die 104A. The IC die 104A comprises a semiconductor substrate 602A having solid state circuitry 604A formed therein. Conductive interconnect 606A is formed on the semiconductor substrate 602A over the solid state circuitry 604A. The conductive interconnect 606A includes alternating layers of conductive material and layers of dielectric material. The interconnects 108A are coupled to the conductive interconnect 606A. The conductive interconnect 606A also includes inter-die contacts 608A. The inter-die contacts 608A are configured for coupling with bridge interconnects 112A of the bridge module 110.

Figure 6B:
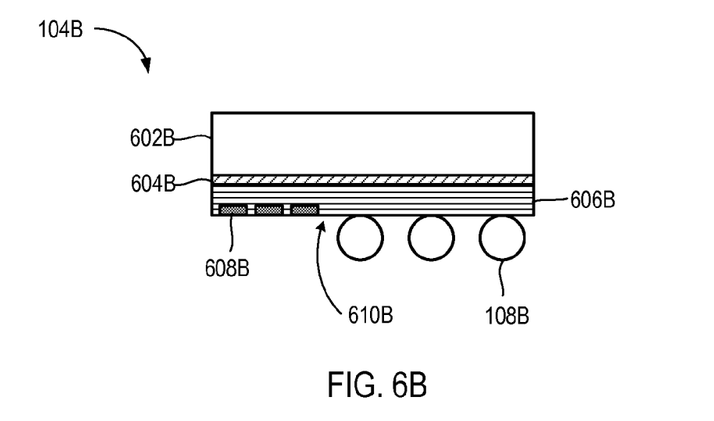

FIG. 6B is a schematic cross-sectional diagram showing an example of the IC die 104B. The IC die 104B is configured similarly to the IC die 104A. The IC die 104B comprises a semiconductor substrate 602B having solid state circuitry 604B formed therein. Conductive interconnect 606B is formed on the semiconductor substrate 602B over the solid state circuitry 604B. The conductive interconnect 606B includes alternating layers of conductive material and layers of dielectric material. The interconnects 108B are coupled to the conductive interconnect 606B. The conductive interconnect 606B also includes inter-die contacts 608B. The inter-die contacts 608B are configured for coupling with bridge interconnects 112B of the bridge module 110.

Figure 7:
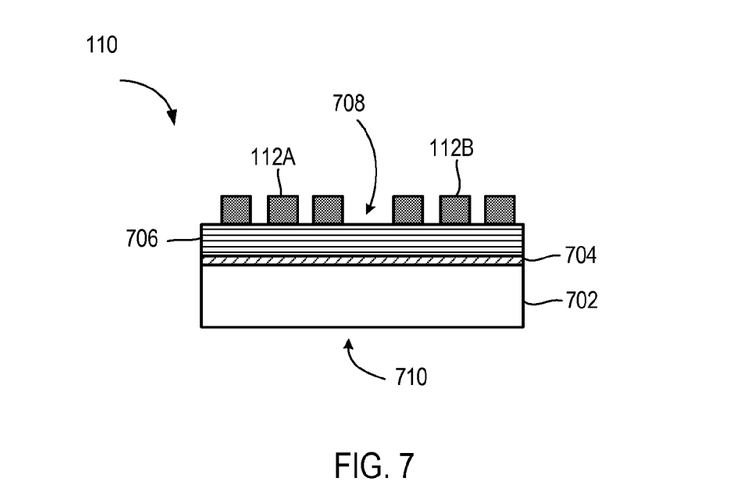
FIG. 7 is a schematic cross-sectional diagram showing an example of a bridge module configured to interconnect IC die.

FIG. 7 is a schematic cross-sectional diagram showing an example of the bridge module 110. The bridge module 110 comprises a substrate 702 having conductive interconnect 706 formed thereon. The conductive interconnect 706 comprises alternating layers of conductive material and layers of dielectric material. The bridge interconnects 112 are coupled to the conductive interconnect 706. In an example, the substrate 702 comprises a ceramic or organic substrate. In another example, the substrate 702 comprises a semiconductor substrate. In some examples, the substrate 702 comprises a semiconductor substrate having solid state circuitry 704 formed therein.

Figure 8:
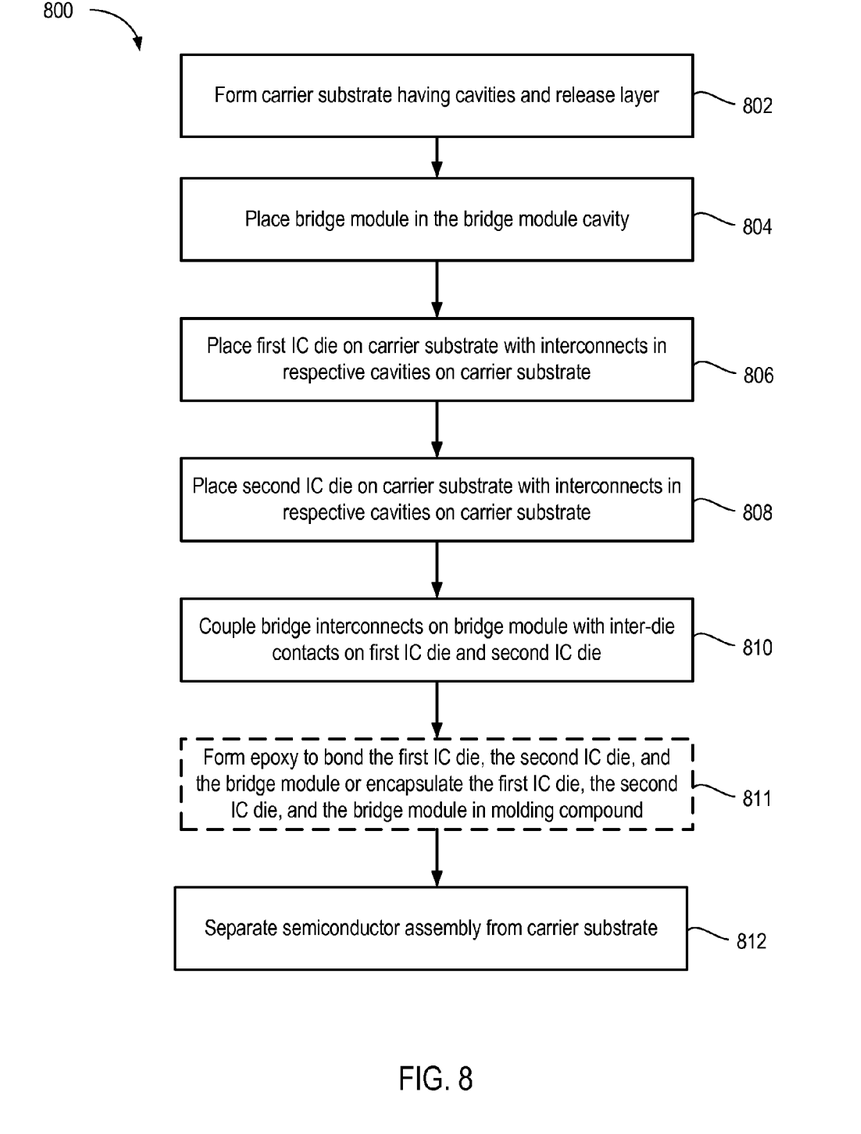
FIG. 8 is a flow diagram depicting an example of a method for manufacturing a semiconductor assembly.

FIG. 8 is a flow diagram depicting an example of a method 800 for manufacturing a semiconductor assembly. The method 800 begins at step 802, where a carrier substrate is formed having cavities and a release layer (FIG. 2A). The carrier substrate can comprise, for example, a silicon substrate. The cavities can be formed using conventional silicon processing techniques.

At step 804, a bridge module is placed in a bridge module cavity of the carrier substrate (FIG. 2B). The bridge module can be a ceramic, organic, or semiconductor substrate. The bridge module is pre-fabricated and can include various layers of metallization formed thereon. If the bridge module comprises a semiconductor substrate, the bridge module can include active circuitry formed therein and electrically coupled to the metallization. The bridge module 804 can be fabricated using conventional semiconductor processing techniques.

At step 806, a first IC die is placed on the carrier substrate with interconnects in respective cavities of the carrier substrate (FIG. 2C). At step 808, a second IC die is placed on the carrier substrate with interconnects in respective cavities of the carrier substrate (FIG. 2C). Each of the IC die can be pre-fabricated and can include active circuitry and metallization formed thereon. Portions of a top metal layer can be exposed as bond pads to which the interconnects are attached. The interconnects can comprise, for example, solder interconnects (e.g., C4 bumps). The first and second IC die can be fabricated using conventional semiconductor processing techniques.

At step 810, bridge interconnects on the bridge module are coupled with inter-die contacts on the first and second IC die (FIG. 3A or FIG. 4A). In an example, the bridge interconnects comprise solder bumps (e.g., C4 bumps) that are soldered to respective inter-die contacts of the IC die. In another example, the bridge interconnects comprise metal contacts that are bonded to respective inter-die contacts of the IC die (e.g., diffusion bonding, pressure joining, thermocompression welding, each of which is generally referred to as "thermocompression bonding" herein). In such an example, the bridge interconnects can comprise aluminum, copper, gold, or the like.

At optional step 811, the first IC die, the second IC die, and the bridge die are bonded using epoxy or are encapsulated with a molding compound. At step 812, the semiconductor assembly is separated from the carrier substrate (FIG. 3B or FIG. 4B).

While the foregoing is directed to specific examples, other and further examples may be devised without departing from the basic scope thereof, and the scope thereof is determined by the claims that follow.

What is claimed is:

1. A semiconductor assembly, comprising:
a first integrated circuit (IC) die having, on a top side thereof, first solder bumps of a plurality of solder bumps and first inter-die contacts of a plurality of inter-die contacts;
a second IC die having, on a top side thereof, second solder bumps of the plurality of solder bumps and second inter-die contacts of the plurality of inter-die contracts; and
a bridge module disposed between the first solder bumps and the second solder bumps, the bridge module including:
bridge interconnects on a top side of the bridge module, the bridge interconnects mechanically and electrically coupled to the plurality of inter-die contacts; and
one or more layers of conductive interconnect disposed on the top side of the bridge module configured to route signals between the first IC and the second IC; and
wherein a back side of the bridge module does not extend beyond a height of the plurality of solder bumps.

2. The semiconductor assembly of claim 1, further comprising:
an epoxy bonding the first IC die to the second IC die, and the bridge module to each of the first IC die and the second IC die.

3. The semiconductor assembly of claim 1, further comprising:
a molding compound encapsulating the first IC die, the second IC die, and the bridge module.

4. The semiconductor assembly of claim 1, wherein the bridge module comprises a ceramic, organic, or semiconductor substrate.

5. The semiconductor assembly of claim 1, wherein the bridge module comprises a semiconductor substrate comprising active circuitry.

6. An integrated circuit (IC) package, comprising:
a package substrate;
a first integrated circuit (IC) die having, on a top side thereof, first interconnects of a plurality of interconnects and first inter-die contacts of a plurality of inter-die contacts, the first interconnects electrically and mechanically coupled to a top side of the package substrate and disposed outside of the package substrate;
a second IC die having, on a top side thereof, second interconnects of the plurality of interconnects and second inter-die contacts of the plurality of inter-die contracts, the second interconnects electrically and mechanically coupled to the top side of the package substrate and disposed outside of the package substrate; and
a bridge module disposed between the first interconnects and the second interconnects, a backside of the bridge module being spaced apart from the package substrate and not extending beyond a height of the plurality of interconnects, the bridge module including:
bridge interconnects on a top side of the bridge module, the bridge interconnects mechanically and electrically coupled to the plurality of inter-die contacts; and
one or more layers of conductive interconnect disposed on the top side of the bridge module configured to route signals between the first IC and the second IC.

7. The IC package of claim 6, further comprising:
an epoxy bonding the first IC die to the second IC die, and the bridge module to each of the first IC die and the second IC die.

8. The IC package of claim 6, further comprising:
a molding compound encapsulating the first IC die, the second IC die, and the bridge module.

9. The IC package of claim 6, further comprising:
an underfill disposed between each of the first IC die, the second IC die, and the bridge module and the top side of the package substrate.

10. The IC package of claim 6, wherein the package substrate comprises a plurality of interconnects on a backside thereof.

11. The IC package of claim 6, wherein the bridge module comprises a pre-fabricated substrate separate from the package substrate.

12. The IC package of claim 6, wherein the bridge module comprises a semiconductor substrate comprising active circuitry.

* * * * *